United States Patent
Miller et al.

(10) Patent No.: US 11,696,071 B2
(45) Date of Patent: *Jul. 4, 2023

(54) CORONA DETECTION USING AUDIO DATA

(71) Applicant: Hubbell Incorporated, Shelton, CT (US)

(72) Inventors: Gary Michael Miller, Kearneysville, WV (US); Bernard Chenault Crutcher, Londonderry, NH (US); Gaylord Zahlman, Manchester, NH (US)

(73) Assignee: Hubbell Incorporated, Shelton, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/867,901

(22) Filed: Jul. 19, 2022

(65) Prior Publication Data

US 2022/0353612 A1 Nov. 3, 2022

Related U.S. Application Data

(63) Continuation of application No. 16/637,857, filed as application No. PCT/US2018/046212 on Aug. 10, 2018, now Pat. No. 11,395,066.
(Continued)

(51) Int. Cl.
*G01R 31/08* (2020.01)
*H04R 3/00* (2006.01)
(Continued)

(52) U.S. Cl.
CPC .............. *H04R 3/007* (2013.01); *G01H 3/06* (2013.01); *G01R 31/00* (2013.01);
(Continued)

(58) Field of Classification Search
CPC ...... G01R 31/1209; G01R 31/14; G01H 3/06; H04R 29/004
See application file for complete search history.

(56) References Cited

U.S. PATENT DOCUMENTS 4,095,173 A * 6/1978 Darrel ................ G01R 31/1209
324/535
4,095,174 A 6/1978 Ishido
(Continued)

FOREIGN PATENT DOCUMENTS

WO 2016151298 9/2016

OTHER PUBLICATIONS

Dos Reis Clovis Ferreira et al: "Comparative analysis between impulsive detection methods applied on partial discharge acoustic signals", 2014 IEEE International Instrumentation and Measurement Technology Conference(I2MTC) Proceedings, IEEE, May 12, 2014, pp. 418-421.
(Continued)

*Primary Examiner* — Thang X Le
(74) *Attorney, Agent, or Firm* — Michael Best & Friedrich LLP

(57) ABSTRACT

Systems, methods, and apparatus for corona detection using audio data are provided. In one example embodiment, the method includes obtaining, by one or more computing devices, audio data indicative of audio associated with an electrical system for at least one time interval. The method includes partitioning, by the one or more computing devices, the audio data for the time interval into a plurality of time windows. The method includes determining, by the one or more computing devices, a signal indicative of a presence of corona based at least in part on audio data collected within
(Continued)

an identified time window of the plurality of time windows relative to audio data collected for a remainder of the time interval.

17 Claims, 13 Drawing Sheets

Related U.S. Application Data

(60) Provisional application No. 62/560,359, filed on Sep. 19, 2017, provisional application No. 62/544,164, filed on Aug. 11, 2017.

(51) Int. Cl.
*G01R 31/00* (2006.01)
*G01R 31/12* (2020.01)
*G01H 3/06* (2006.01)
*G10K 11/178* (2006.01)
*H04R 1/32* (2006.01)
*G01H 3/00* (2006.01)
*H04R 29/00* (2006.01)

(52) U.S. Cl.
CPC ...... *G01R 31/1209* (2013.01); *G10K 11/1785* (2018.01); *H04R 1/326* (2013.01); *G01H 3/00* (2013.01); *H04R 29/004* (2013.01); *H04R 2499/13* (2013.01)

(56) References Cited

U.S. PATENT DOCUMENTS

| | | | |
|---|---|---|---|
| 6,247,353 B1 | 6/2001 | Battenberg et al. | |
| 6,340,890 B1* | 1/2002 | Bengtsson | G01R 31/1209 324/536 |
| 7,180,303 B1 | 2/2007 | Chen et al. | |
| 8,002,592 B2 | 8/2011 | Crutcher et al. | |
| 8,126,664 B2* | 2/2012 | Fournier | G01R 31/1272 702/58 |
| 9,557,365 B2 | 1/2017 | Miller | |
| 9,697,724 B2 | 7/2017 | Miller et al. | |
| 9,897,643 B2 | 2/2018 | Miller | |
| 2004/0037437 A1* | 2/2004 | Symons | H04R 3/005 381/91 |
| 2006/0259281 A1 | 11/2006 | Kuppuswamy | |
| 2010/0060290 A1 | 3/2010 | Sanderson et al. | |
| 2012/0105073 A1 | 5/2012 | Kuettner et al. | |
| 2012/0243694 A1 | 9/2012 | Bradley et al. | |
| 2013/0191050 A1* | 7/2013 | Juge | G01R 31/1254 702/59 |
| 2013/0297665 A1 | 11/2013 | Nikitin | |
| 2014/0270205 A1 | 9/2014 | Miller | |
| 2015/0304487 A1 | 10/2015 | Chaput et al. | |
| 2017/0168024 A1 | 6/2017 | Dehghan Niri | |
| 2017/0184655 A1 | 6/2017 | Alberto | |
| 2017/0186304 A1 | 6/2017 | Stock et al. | |
| 2017/0206781 A1 | 7/2017 | Miller et al. | |
| 2018/0238955 A1 | 8/2018 | Bango et al. | |

OTHER PUBLICATIONS

European Patent Application No. 18845212 Supplementary Search Report and Examination Opinion dated Mar. 15, 2021.
Canadian Patent Application No. 3072570 Examination Report dated May 7, 2021 (4 pages).
Svoboda "Transmission Line Security Monitor: Final Report," Idaho National Laboratory (INL), Apr. 2011—50 pages.
PCT International Search Report and Written Opinion for corresponding PCT Application No. PCT/US2018/046212, dated Dec. 6, 2018, 11 pages.

* cited by examiner

CORONA DETECTION USING AUDIO DATA

PRIORITY CLAIM

The present application claims the benefit of U.S. Non-Provisional patent application Ser. No. 16/637,857, filed Feb. 10, 2020, which claims the benefit of PCT Patent Application Serial No. PCT/US2018/046212, filed Aug. 10, 2018, which is incorporated herein by reference, which claims the benefit of priority of U.S. Provisional Patent Application Ser. No. 62/560,359, filed on Sep. 19, 2017, titled "Corona Detection Using Audio Data," which is incorporated herein by reference, and U.S. Provisional Patent Application Ser. No. 62/544,164, filed Aug. 11, 2017, titled "Corona Detection Using Audio Data," which is incorporated herein by reference.

FIELD

The present disclosure relates generally to detection of corona using audio data.

BACKGROUND

Corona is a type of electric discharge occurring in electrical systems in areas of very high electric field strength. Corona can be characterized by a glow, electromagnetic emanation, and/or a sound often described as sizzling bacon. For instance, when corona is visible, it can have a blue glow and can have significant brightness in ultraviolet wavelengths. Corona can cause damage to, for instance, wires, insulators, and/or other components of an electrical system.

Techniques for detecting corona can include ultraviolet detection, ultrasonic detection, and/or RF emission detection. However, such techniques can suffer disadvantages. For example, power lines can generate corona that can be detected using images captured by cameras operating in the ultraviolet spectrum. Such cameras, however, can be large and expensive. In some cases, the detection methods can require a user to manually operate a device and aim at an area suspected to contain corona. As such the detection methods can be cumbersome and non-autonomous.

SUMMARY

Aspects and advantages of embodiments of the present disclosure will be set forth in part in the following description, or may be learned from the description, or may be learned through practice of the embodiments.

One example aspect of the present disclosure is directed to a method for detecting corona in an electrical system. The method can include obtaining, by one or more computing devices, audio data indicative of audio associated with the electrical system for at least one time interval. The method can include partitioning, by the one or more computing devices, the audio data for the time interval into a plurality of time windows. The method can include determining, by the one or more computing devices, a signal indicative of a presence of corona based at least in part on audio data collected within an identified time window of the plurality of time windows relative to audio data collected for a remainder of the time interval.

Other examples aspects of the present disclosure are directed to apparatus, electronic devices, non-transitory computer-readable media, smart clamps, power devices, and other devices configured to detect corona in electrical systems based at least in part on audio data.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
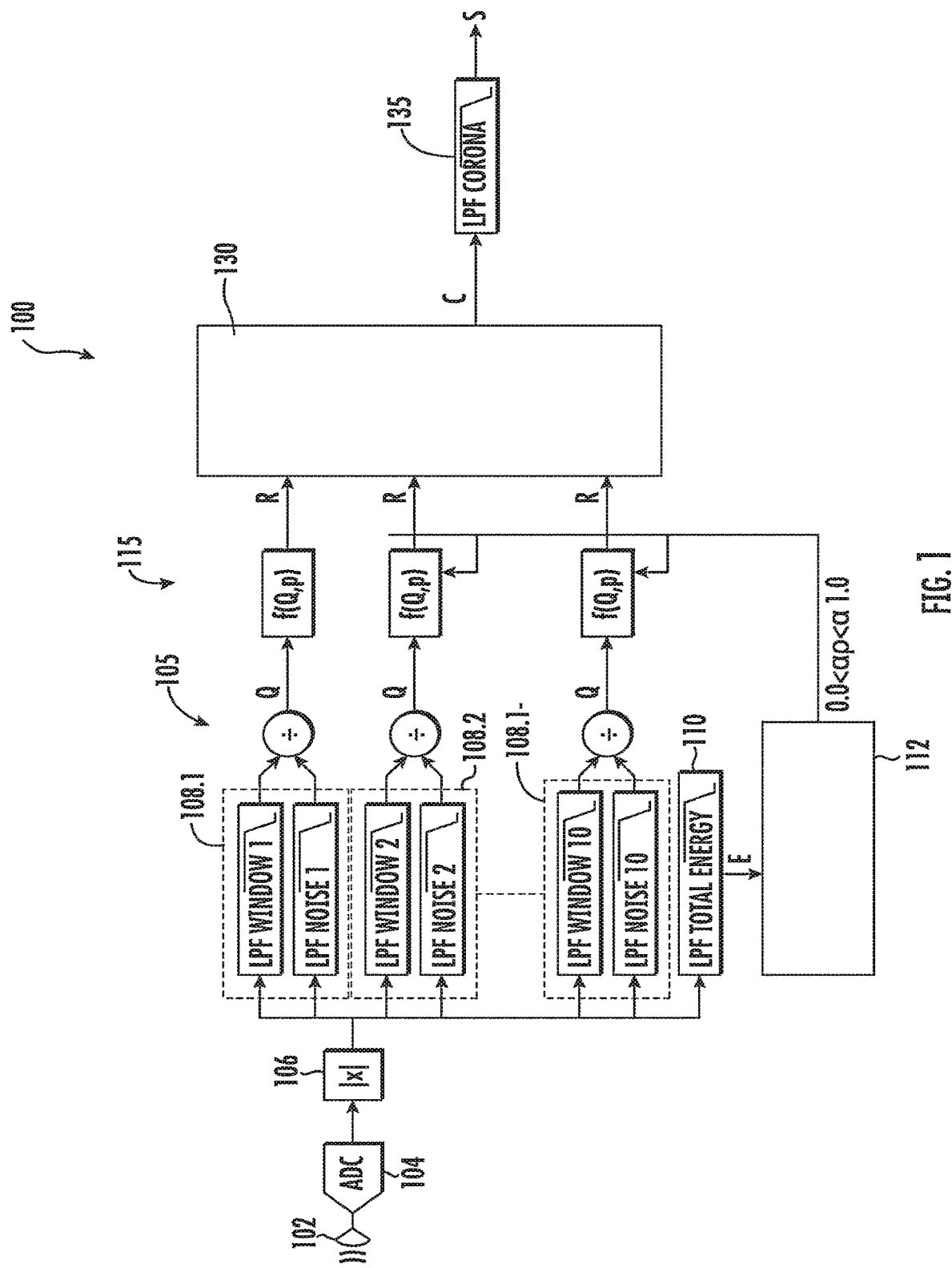
FIG. 1 depicts a block diagram of example processing of audio data for corona detection according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment.

Thus, it is intended that aspects of the present disclosure cover such modifications and variations.

Example aspects of the present disclosure are directed to corona detection using audio data. Certain technology for identifying corona can involve detection of energy at a primary frequency (e.g., 60 Hz, 50 Hz, etc.) for alternating current in an electrical system with some harmonics of the primary frequency. However, in some cases, there can be little energy in the audio band at the primary frequency. A pulse or multiple pulses of high frequency can occur approximately at the peak voltage, but the pulse position can move substantially relative to the peak. This can make locating the peak for corona detection difficult, particularly in the presence of a 60 Hz or 50 Hz hum created by, for instance, transformers or power lines in the power system. Moreover, the pulse shape associated with corona can be chaotic. The pulse can even disappear for several consecutive cycles during a high level corona event, making corona detection difficult.

According to example aspects of the present disclosure, audio data obtained, for instance, using a microphone is used to identify corona discharges in an electrical system (e.g., such as power transmission lines). More particularly, energy for the audio data can be obtained for a time interval that is selected, for instance, based at least in part on the primary frequency of the electrical system (e.g., 60 Hz or 50 Hz), such as a sensed primary frequency as determined by one or more feedback devices. The audio data for the time interval can be partitioned into a plurality of time windows that are a fraction of the time interval (e.g. time windows are 10% of the time interval). Energy associated with the audio data can be determined for each time window and for a time period outside the time window but within the time interval. A ratio of the energy values can be determined and used to provide a signal indicative of the presence of corona.

The systems and methods of the present disclosure can be used to detect corona in a variety of applications. For instance, in some embodiments, a device attached to a power line, such as a clamp, can be used as an attachment point for the corona sensor. In other cases, the corona sensor can be attached to the power line or proximate to the power line. The corona sensor can include or be in communication with a microphone for obtaining audio data and/or can otherwise have access to audio data. The corona sensor can include one or more computing devices (e.g., processors and/or memory devices) that implement corona detection logic used to detect the presence of corona by processing the audio data according to example embodiments of the present disclosure. In some embodiments, the corona sensor can include communication capability and can communicate (e.g., wirelessly transmit) information (e.g., corona detection information) from the suspension clamp.

For instance, in some embodiments, a control action can be taken in response to the presence of corona. The control action can include providing a notification indicative of the presence of corona. For instance, the notification can be provided over a communication interface (e.g., over a network). In response to the notification, various measures can be taken in response to the presence of corona.

For instance, in some embodiments, upon the detection of corona according to example embodiments of the present disclosure, a notification can be communicated over a network. The notification can provide information associated with a corona event (e.g., timing and/or location of the corona event). The notification can be communicated in any suitable format (e.g., binary code, email, text message, communication signal, telephone communication, etc.)

In some embodiments, the notification can be provided to a power control system. The power control system can process the information and take corrective action based on the notification. For instance, the power control system can temporarily adjust the power over a transmission line in response to the corona event. The power control system can send an alert signal ordering a maintenance action to address the corona event.

Aspects of the present disclosure are discussed with reference to implementing corona detection in a clamp for purposes of illustration and discussion. Those of ordinary skill in the art, using the disclosures provided herein, will understand that the systems and methods disclosed herein can be used in a variety of other applications. For example, the systems and methods of the present disclosure can be implemented using hand held devices; drones; directional microphones; user devices (e.g., smartphones, tablets, laptops, etc.); in utility cabinets; in vehicles (e.g., aerial vehicles and/or ground based vehicles); as part of ground fault interrupter systems, and/or in other applications.

Aspects of the present disclosure can provide a number of technical effects and benefits. For example, by using audio signals, corona detection can be implemented using signals obtained with less expensive equipment, such as microphones. Moreover, corona detection according to example embodiments can look for pulsed energy in the audio band that repeats at approximately the line frequency of the electrical system. This can allow for a substantial tolerance for pulse variation while still reliably providing a signal for detection of corona.

In addition, aspects of present disclosure can provide an improvement to computing technology, such as computing technology implemented in, for instance, a clamp. For example, the systems and methods according to example aspects of the present disclosure can provide more reliable processing of audio signals to identify corona, leading to fewer false positives and more efficient use of computing resources (e.g., processors, memory devices, etc.). The computing resources can be preserved for more core functions, such as recordation and storage of other data associated with an electrical system, communicating data via a network interface, etc. In addition, communication of more reliable data and fewer false positives can reduce communication latencies resulting from communicating unnecessary or unreliable data over a network.

With reference now to the FIGS., example embodiments of the present disclosure will now be set forth. FIG. 1 depicts a block diagram of example processing logic 100 for corona detection using audio data according to example embodiments of the present disclosure. A microphone 102 can collect audio signals. The microphone 102 can be any device configured to capture audio data. The audio data can be associated with the portion of the audible frequency range at which typical human beings can hear. For instance, the audio data can be associated with the audible frequency range of about 20 Hz to about 20,000 Hz. The use of the term "about" in conjunction with a numerical value is intended to refer to within 20% of the stated amount.

The audio data collected by the microphone can be sampled at analog to digital conversion block 104 to convert the audio data from an analog signal to a digital signal. Any suitable sample rate can be used in the present disclosure. For instance, in one example implementation, the sample rate can be about 44,100 samples per second. Other sample rates can be used, such as 48,000 samples per second, 96,000 samples per second, 32,000 samples per second or other sample rate. The sample frequency may or may not be locked to the primary frequency of the electrical system. At block 106, the processing logic takes the absolute value of the audio data.

The audio data can be collected for one or more time intervals. The time interval is determined based on the primary frequency of the electrical system. For instance, in a 60 Hz system, the time interval can be about 16.67 ms. In a 50 Hz system, the time interval can be about 20 ms. In some embodiments, the time interval can be determined based at least in part on a sensed primary frequency of the electrical system.

The time interval can be partitioned into a plurality of time windows. For instance, in example implementations, each time window can have a duration of about 10% of a duration of the time interval. As shown, in FIG. 1, each time window can be associated with a computation gate 108.1, 108.2, . . . 108.10. FIG. 1 contemplates ten computation gates 108.1, 108.2, . . . 108.10. However, more or fewer computation gates can be used without deviating from the scope of the present disclosure.

Each computation gate includes a first low pass filter ("LPW Window") and a second low pass filter ("LPF Noise"). The first filter can be configured to determine a first energy associated with audio data collected during the time window. The second filter can be configured to determine a second energy associated with the remainder of the time interval.

In some embodiments, the first filter can be a single pole low pass filter. The first filter can be associated with a transfer function:

$$y[n]=\alpha_c *y[n-1]+(1-\alpha_c)*x[n]$$

where n is the sample point, y is the output of the transfer function, x is the absolute value of the audio data, and $\alpha_c$ is a constant. The value of $\alpha_c$ can be selected to provide a compromise between fast response and good average. In some embodiments, the value of $\alpha_c$ can be in the range of 0.95 to 0.9999999, such as in the range of about 0.98 to about 0.9999999, such as in the range of about 0.99 to about 0.9999999.

In some embodiments, the second filter can be a single pole low pass filter. The first filter can be associated with a transfer function:

$$y[n]=\alpha_n *y[n-1]+(1-\alpha_n)*x[n]$$

where n is the sample point, y is the output of the transfer function, x is the absolute value of the audio data, and $\alpha_c$ is a constant. The value of $\alpha_n$ can be selected to provide a compromise between fast response and good average. In some embodiments, the value of $\alpha_n$ can be in the range of 0.95 to 0.9999999, such as in the range of about 0.98 to about 0.9999999, such as in the range of about 0.99 to about 0.9999999. The value of $\alpha_c$ and $\alpha_n$ can be selected such that the step response of the first filter and the second filter is the same within the time interval. Other suitable measurements of the first energy and second energy can be used without deviating from the scope of the present disclosure.

Figure 2:
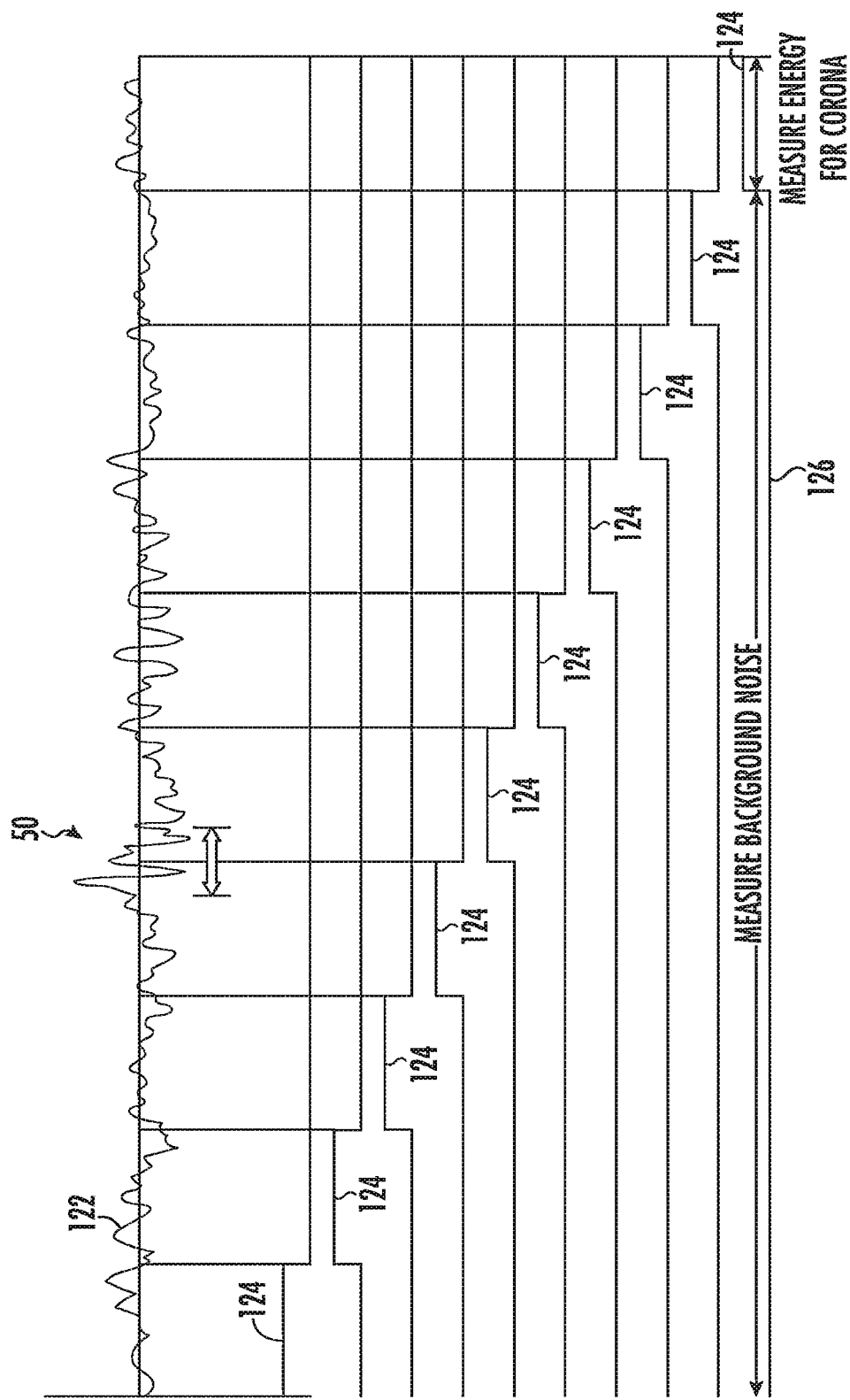
FIG. 2 depicts example audio data for a time interval partitioned into a plurality of time windows according to example embodiments of the present disclosure.

FIG. 2 depicts a graphical representation 120 of partitioning audio data for a time interval into a plurality of time windows according to example embodiments of the present disclosure. As shown, the audio data 122 includes a portion 50 associated with a corona event. The audio data is partitioned into ten time windows 124. Each time window 124 is associated with a duration of about 10% of a duration of the time interval. Each computation gate 108.1, 108.2, . . . 108.10 of FIG. 1 determines an energy associated with audio data within the time window 124 as well as energy associated with audio data in the remainder 126 (e.g., noise) of the time interval.

Referring to FIG. 1, at stage 105, the processing logic 100 determines ratios Q of the first energy associated with the audio data within a time window to the second energy associated with the remainder of the time interval. If random noise is present, the output of the first filter and the second filter for each computation gate 108.1, 108.2, . . . 108.n will be about the same. If corona exists within a time window, the first energy associated with audio data within the time window will be higher than the second energy associated with audio data within the remainder of the time interval. In this way, the ratio of the first energy to the second energy for each time window can be indicative of the presence of corona within the time window.

Referring to FIG. 1, a sound level computation 110 is always active during a time interval. The sound level computation 110 determines a total energy E for the time interval. The total energy E can be used to determine an adequacy of the sound level to detect corona and to what degree. If the total energy E is less than a first threshold, corona detection may not be permitted. If the total energy E is between a first threshold and a second threshold, corona detection can be linearly scaled as discussed below. If the total energy E is above the second threshold, full corona detection based on the ratios Q can be permitted.

More particularly, a signal indicative of total energy E can be provided to function 112 to generate scaling factor p. Scaling factor p can be used for scaling ratios Q to scaled ratios based on the adequacy of audio data to detect corona for the time interval.

Figure 3:
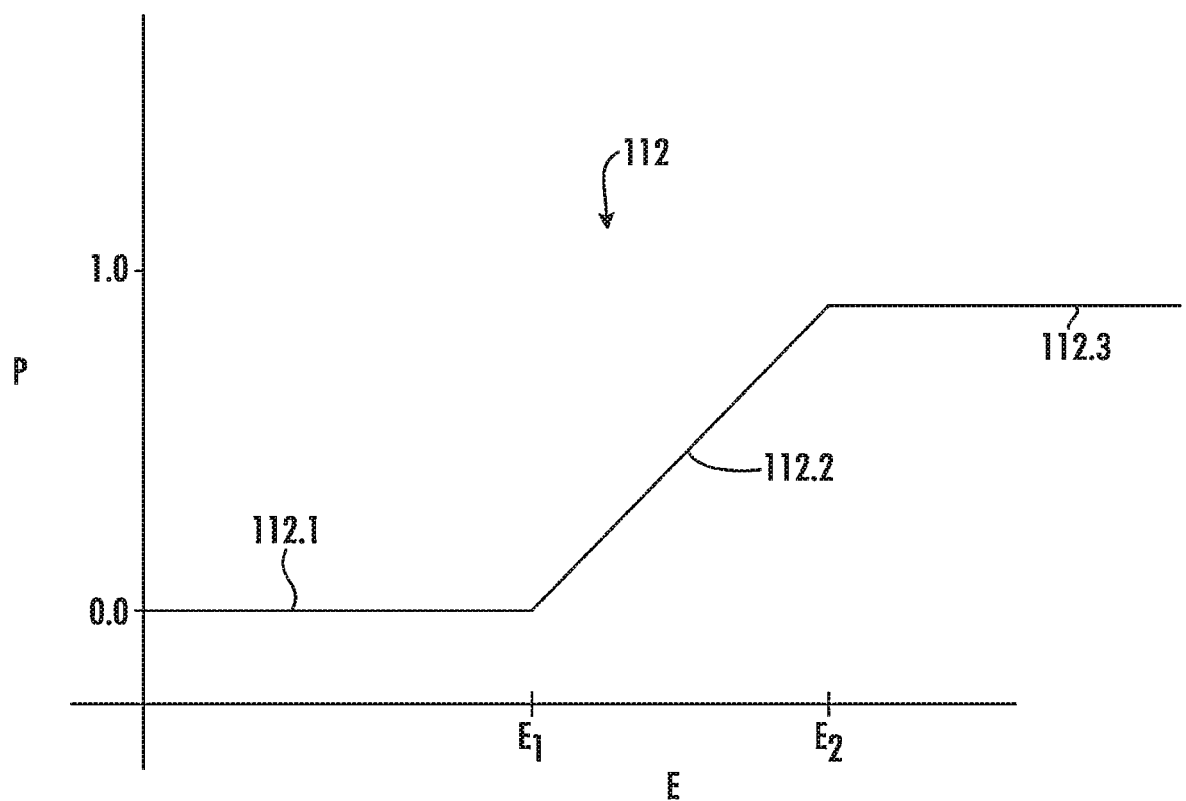
FIG. 3 depicts an example scaling function for scaling ratios based on total energy of audio data for a time interval according to example embodiments of the present disclosure.

FIG. 3 depicts a graphical representation of one example function 112 for generating scaling factor p based at least in part on the total energy E for the time interval. FIG. 3 plots total energy E along the horizontal axis and scaling factor p along the vertical axis. As shown by portion 112.1 of function 112, the scaling factor p can be 0 when the total energy E is less than a first threshold $E_1$. This can disable corona detection when the audio signal is too low. As shown by portion 112.2 of function 112, the scaling factor p can vary linearly when the total energy is greater than the first threshold $E_1$ but less than a second threshold $E_2$. This can cause for linear scaling of the corona detection at intermediate sound levels. While linear scaling is shown in FIG. 3, other suitable scaling regimes (e.g., exponential, sigmoid, hyperbolic tangent, non-linear, step function, etc.) can be used without deviating from the scope of the present disclosure. As shown by portion 112.3 of function 112, the scaling factor p can be 1 when the total energy is greater than the second threshold $E_2$ to allow for full corona detection.

Referring to FIG. 1 at stage 115, the processing logic 100 can determine a scaled ratio R for each time window using a function that determines the scaled ratio R based at least in part on the ratio Q for the time window and the scaling factor p. In some example embodiments, the function implemented at stage 115 can be:

$$R=p*(Q-1)+1$$

This function scales the value of the scaled ratio R toward 1 when the total signal level of the audio data is low. Other suitable functions can be used without deviating from the scope of the present disclosure.

In some instances, a narrow corona may span two adjacent time windows within a time interval due to the misalignment of the corona event to the time windows. Example aspects of the present disclosure can process the signals based on ratios in adjacent time windows to improve detection of corona that can span several time windows. More particularly, the scaled ratios R can be provided to confidence computation gate 130 to determine a confidence score C indicative of the present of corona based at least in part on scaled ratios of adjacent time windows and/or time windows that are opposing in phase.

More particularly, computation gate 130 can identify a time window with a maximum scaled ratio of the plurality of time windows ("maximum time window"). The computation gate 130 can examine the scaled ratios of the time windows adjacent to the maximum time window, both to the left and to the right. Any value of the scaled ratio above 1 for an adjacent time window can be added to the scaled ratio for the maximum time window.

In addition, a time window opposing in phase (e.g., 180° out of phase) ("opposing phase time window") with the maximum time window can be identified. Time windows adjacent to the opposing phase time window can also be examined. An example implementation is provided below:
1. Find the largest R[n] and record the peak index as 'm'
2. C=R[n]
3. if R[m−1]>1.0 then C=C+(R[m−1]−1)
4. if R[m+1]>1.0 then C=C+(R[m+1]−1)
5. m=m+5//point to bin opposite in phase
6. if R[m]>1.0 then C=C−(R[m]−1)
7. if R[m−1]>1.0 then C=C+(R[m−1]−1)
8. if R[m+1]>1.0 then C=C+(R[m+1]−1)

Figure 4:
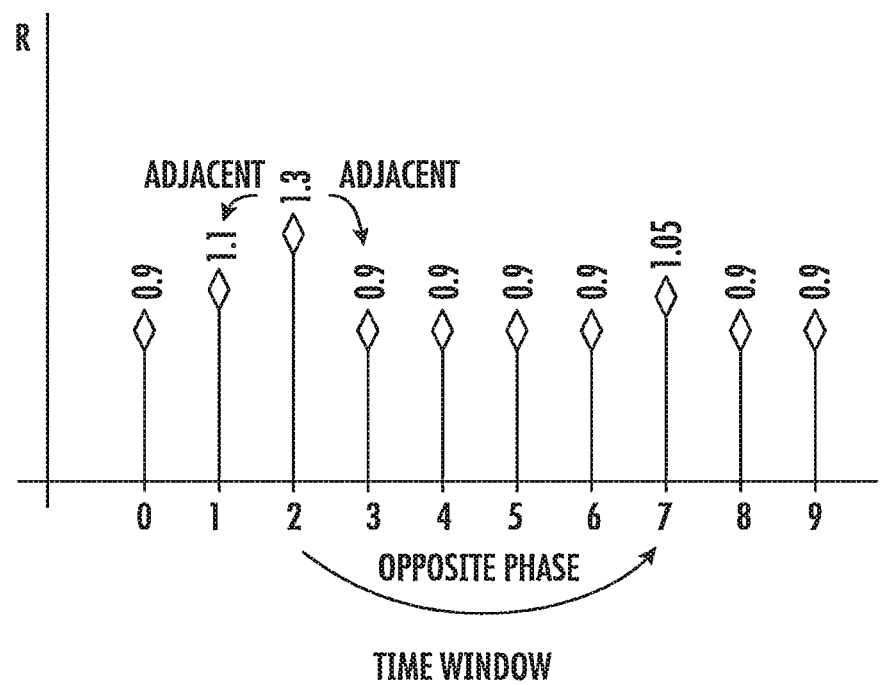
FIG. 4 depicts an example computation of a confidence score indicative of the presence of corona based at least in part on scaled ratios according to example embodiments of the present disclosure.

FIG. 4 depicts an example computation of a confidence score by computation gate 130 according to example embodiments of the present disclosure. FIG. 4 plots scaled ratios R for each of time windows 0-9. As shown, time window 2 is associated with a maximum scaled ratio of 1.3. Adjacent time window 1 has a scaled ratio of 1.1. 0.1 will be added to the scaled ratio of 1.3 to obtain 1.4. Adjacent time window 3 has a scaled ratio of 0.9. No adjustments are made based on this adjacent time window. Time window 7 is opposite in phase to time window 3. Time window 7 has a value 1.05. In that regard, 0.05 is subtracted from 1.4 to obtain a confidence score C of 1.35.

As shown in FIG. 1, the confidence score C can be provided to a low pass filter 135 to determine a signal S indicative of the presence of corona. The low pass filter 135 can be used to smooth over false corona indications. In some embodiments, the confidence score C is presented once per time interval to the low pass filter 135. The low pass filter can be a single pole low pass filter associated with a transfer function:

$$S[n]=\alpha_t*S[n-1]+(1-\alpha_t)*C[n]$$

where n is the sample point, S is the output of the transfer function, C is the confidence score, and $\alpha_t$ is a constant. The value of $\alpha_t$ can be selected to provide a faster response with reduced false triggers. The value of $\alpha_t$ can be in the range of, for instance 0.95 to 0.9999999, such as in the range of about 0.98 to about 0.9999999, such as in the range of about 0.99 to about 0.9999999. The value of $\alpha_t$ can be selected to provide a faster response with reduced false triggers.

The signal S can be indicative of the likelihood of corona within a time interval. For instance, in some implementations, if S is less than 1.2, there is probably no corona. If S is between 1.2 and 1.25, there is probable corona. If S is between 1.25 and 1.4 there is likely corona. If S is greater than 1.4 there is a very high likelihood of corona.

The above signal processing method is just one example of determination of a signal indicative of a presence of corona according to example embodiments of the present disclosure. Variations and modifications can be made to this example method without deviating from the scope of the present disclosure. For instance, in another example, the following function can be used to determine the scale ratio:

$$R=p*(Q-1)$$

This function scales the value of the scaled ratio R towards 0 when the total signal level of the audio data is low. The value of R can be below zero.

As discussed above, the scaled ratios R can be provided to confidence computation gate 130 to determine a confidence score C indicative of the presence of corona based at least in part on scaled ratios of adjacent time windows and/or time windows that are opposing in phase.

More particularly, in this example, computation gate 130 can identify a time window with a maximum scaled ratio of the plurality of time windows ("maximum time window"). The computation gate 130 can examine the scaled ratios of the time windows adjacent to the maximum time window, both to the left and to the right. Any value of the scaled ratio above 0 for an adjacent time window can be added to the scaled ratio for the maximum time window.

In addition, a time window opposing in phase (e.g., 180° out of phase) ("opposing phase time window") with the maximum time window can be identified. Time windows adjacent to the opposing phase time window can also be examined. An example implementation is provided below:
1. Find the largest R[n] and record the peak index as 'm'
2. C=R[n]
3. if R[m−1]>0.0 then C=C+(R[m−1])
4. if R[m+1]>0.0 then C=C+(R[m+1])
5. m=m+5//point to bin opposite in phase
6. if R[m]>0.0 then C=C−(R[m])
7. if R[m−1]>0.0 then C=C+(R[m−1])
8. if R[m+1]>0.0 then C=C+(R[m+1])

Figure 5:
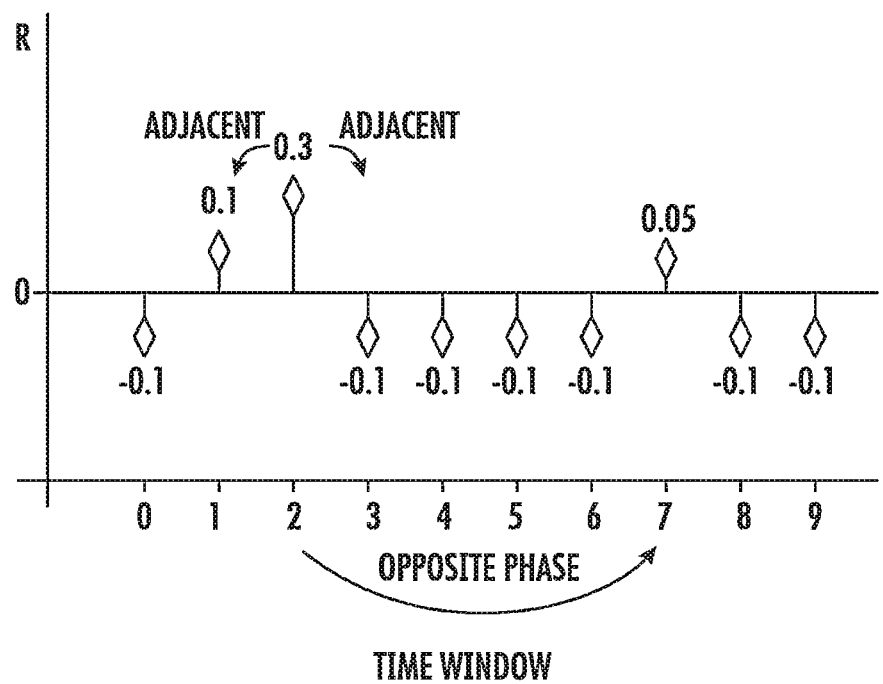
FIG. 5 depicts an example computation of a confidence score indicative of the presence of corona based at least in part on scaled ratios according to example embodiments of the present disclosure.

FIG. 5 depicts an example computation of a confidence score by computation gate 130 according to example embodiments of the present disclosure. FIG. 5 plots scaled ratios R for each of time windows 0-9. As shown, time window 2 is associated with a maximum scaled ratio of 0.3. Adjacent time window 1 has a scaled ratio of 0.1. 0.1 will be added to the scaled ratio of 0.3 to obtain 0.4. Adjacent time window 3 has a scaled ratio of −0.1. No adjustments are made based on this adjacent time window. Time window 7 is opposite in phase to time window 3. Time window 7 has a value 0.05. In that regard, 0.05 is subtracted from 0.4 to obtain a confidence score C of 0.35.

The confidence score C can be provided to a low pass filter 135 to determine a signal S indicative of the presence of corona. The low pass filter 135 can be used to smooth over false corona indications. In some embodiments, the confidence score C is presented once per time interval to the low pass filter 135. The low pass filter can be a single pole low pass filter associated with a transfer function:

$$S[n]=\alpha_t*S[n-1]+(1-\alpha_t)*C[n]$$

where n is the sample point, S is the output of the transfer function, C is the confidence score, and $\alpha_t$ is a constant. The value of $\alpha_t$ can be selected to provide a faster response with reduced false triggers. The value of $\alpha_t$ can be in the range of, for instance, 0.95 to 0.9999999, such as in the range of about 0.98 to about 0.9999999, such as in the range of about 0.99 to about 0.9999999. The value of a can be selected to provide a faster response with reduced false triggers.

The signal S can be indicative of the likelihood of corona within a time interval. For instance, in some implementations, if S is less than 0.2, there is probably no corona. If S is between 0.2 and 0.25, there is probable corona. If S is between 0.25 and 0.4 there is likely corona. If S is greater than 0.4 there is a very high likelihood of corona.

Figure 6:
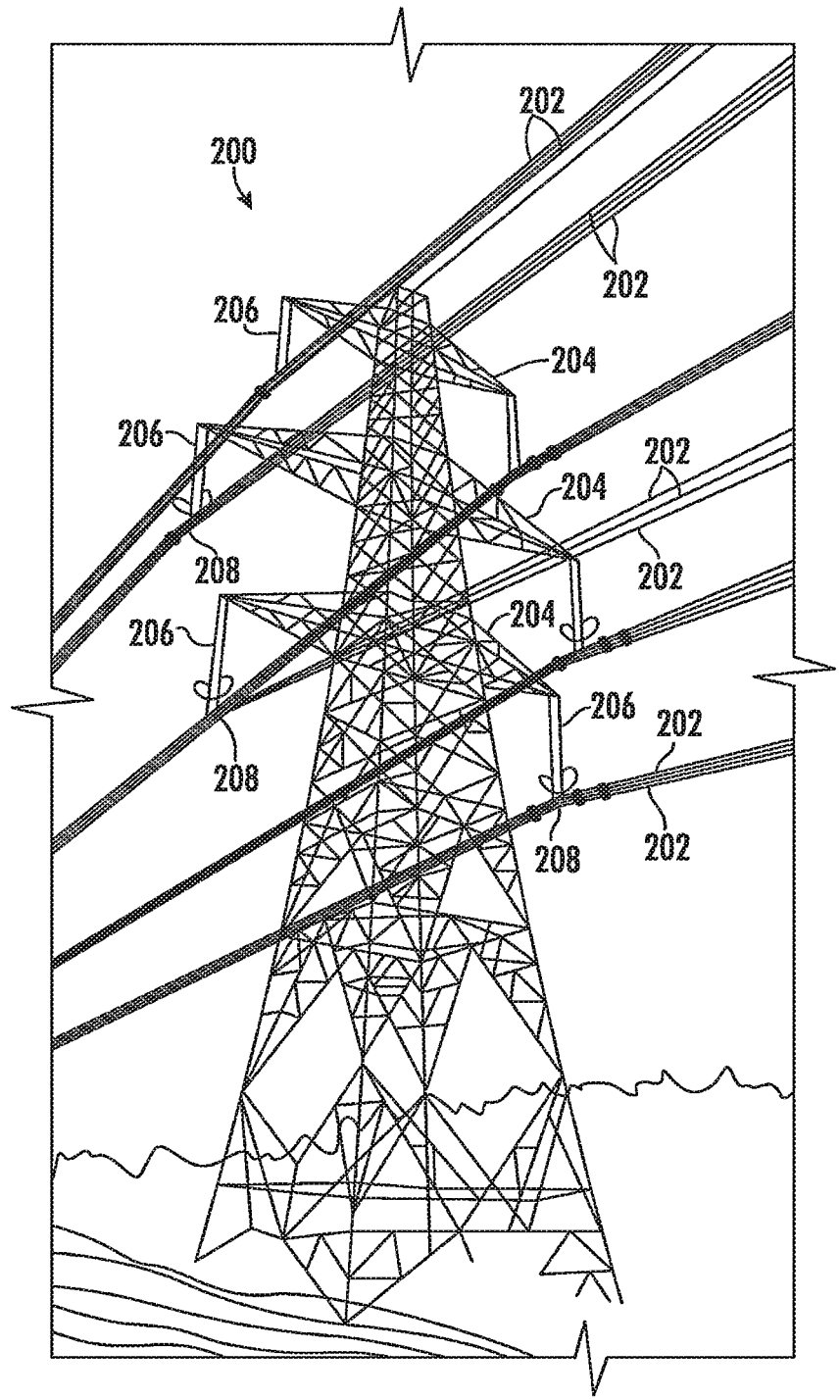
FIG. 6 depicts an example transmission tower supporting transmission lines connected via suspension clamps.

One example application of the present disclosure is for use with a clamp (e.g., a suspension clamp) used in electrical systems. FIG. 6 shows a transmission tower 200 which is used to suspend power transmission lines 202 above the ground. The tower 200 has cantilevered arms 204. Insulators 206 extend down from the arms 204. One or more suspension clamps 208 are located at the bottom ends of the insulators 206. The lines 202 are connected to the suspension clamps. The suspension clamps 208 hold the power transmission lines 202 onto the insulator 206.

Figure 7:
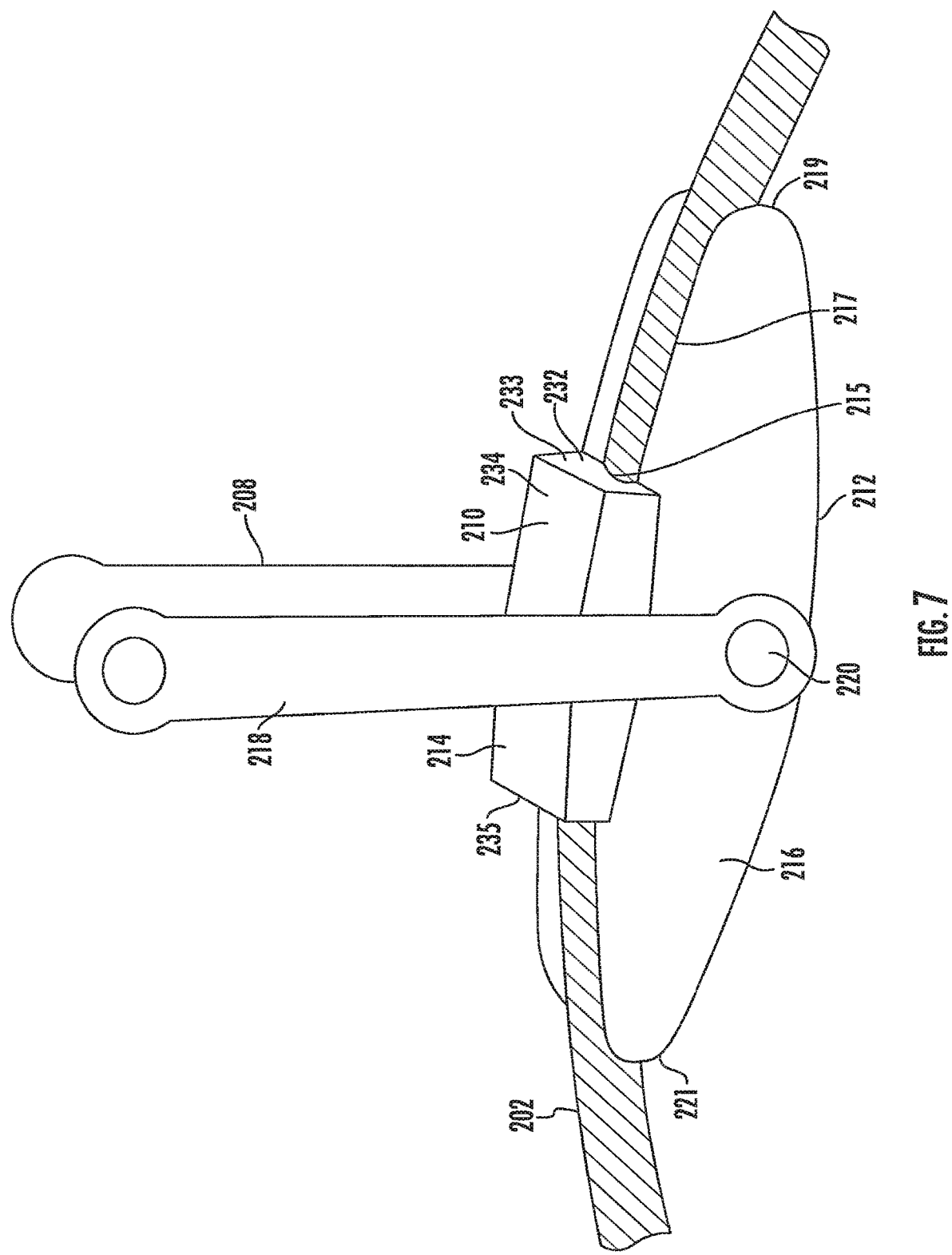
FIG. 7 depicts a perspective view of a suspension clamp.
Figure 8:
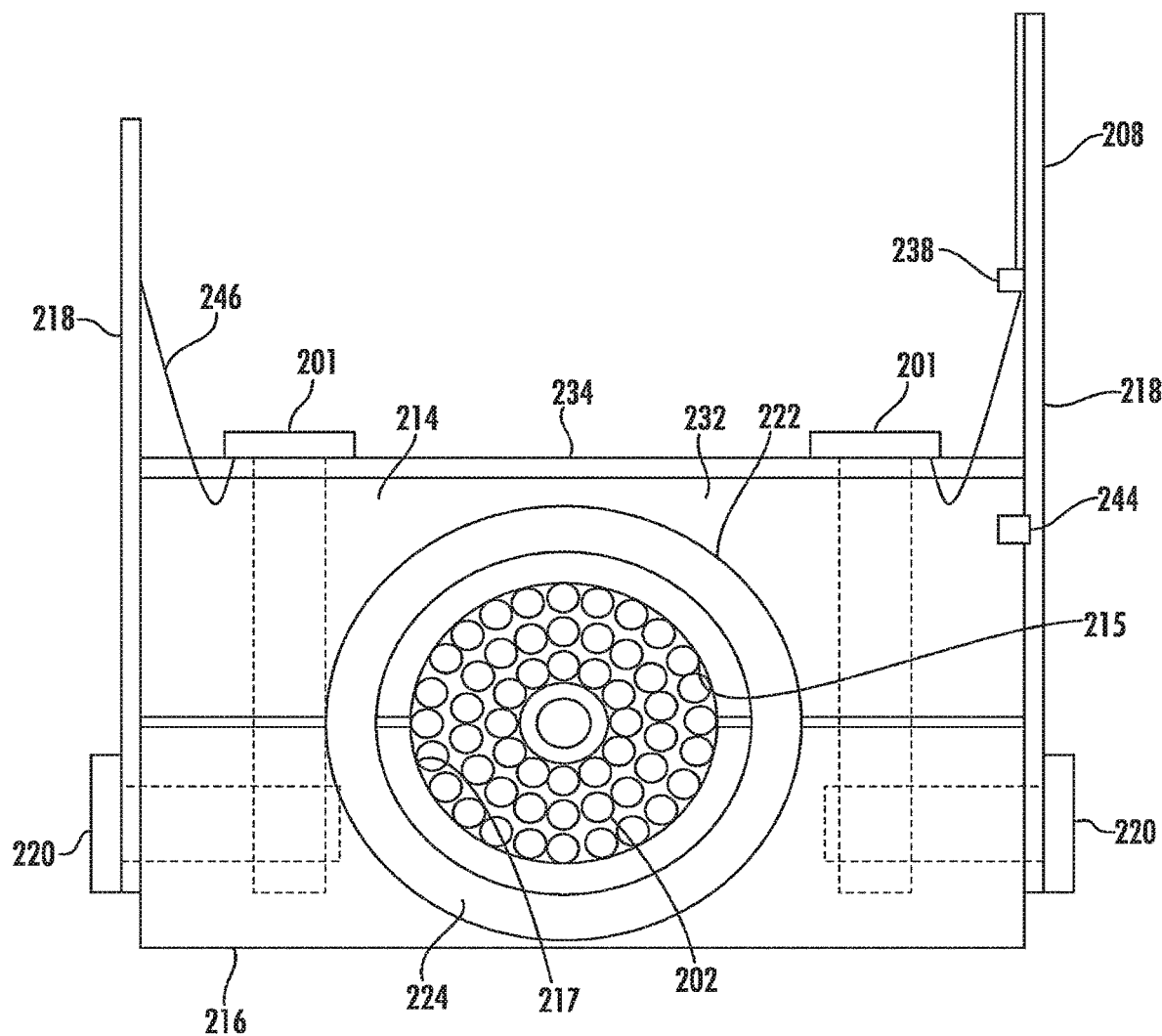
FIG. 8 depicts a cross section view of a suspension clamp.
Figure 9:
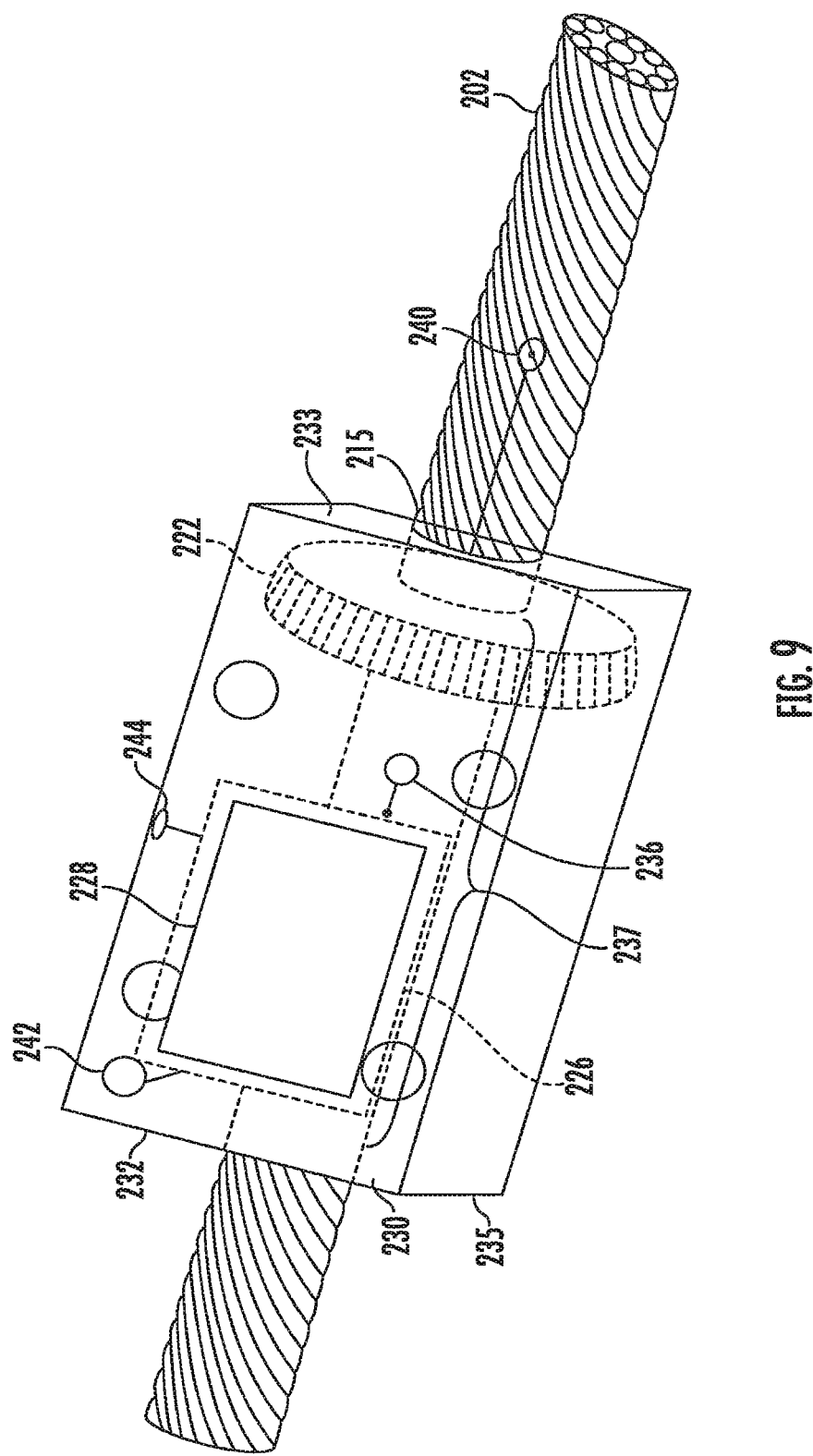
FIG. 9 depicts a perspective view of a portion of a suspension clamp.

FIGS. 7-9 illustrate an example of a suspension clamp 208, which generally includes an upper section 210 and a lower support section 212. These two sections 210, 212 each contain a body 214, 216 which form a suspension case. The bodies 214, 216 each comprise a longitudinal trough (or conductor receiving area) 215, 217 that allow the transmission conductor 202 to be securely seated within the two sections when the two sections are bolted (or fastened) together by threaded fasteners 201 (not shown). This encases the transmission conductor 202 between the two bodies to securely contain the transmission conductor 202 on the clamp 208. Threaded fasteners are not required and any other suitable fastening configuration may be provided. The two bodies 214, 216 connected together are suspended via a metal bracket 218 that attaches to the lower body 216 at points via bolt hardware 220.

The lower body, or lower body section, 216 includes a first end 219 and a second end 221. The conductor receiving area (or conductor contact surface) 217 extends from the first end 219 to the second end 221 along a top side of the lower body 216. The conductor receiving area, including longitudinal trough 217, forms a lower groove portion for contacting a lower half of the conductor 202. A general groove shape is not required, and any suitable configuration may be provided.

In one implementation, the upper and lower sections 210, 212 each have embedded within their respective bodies 214, 216 one-half of a current transformer 222, 224 that is commonly referred to in the industry as a split core current transformer. When these components 222, 224 are joined, they form an electromagnetic circuit that allows, in some applications, the sensing of current passing through the conductor 202. In one implementation, the current transformer is used for current sensing, data collection, data analysis and data formatting devices. In some implementations the current transformer may be located outside of the clamp or similar device or, in some implementations, current may be provided by another means.

The body 214 of the upper section 210 contains a first member 232 and a second member 234 forming a cover plate. The first member 232 comprises a first end 233, a second end 235, and a middle section 237 between the first end 233 and the second end 235. The conductor receiving area (or conductor contact surface) 215 extends from the first end 233 to the second end 235 along a bottom side of the first member 232. The conductor receiving area 215 forms an upper groove portion for contacting an upper half of the conductor 202. A general groove shape is not required, and any suitable configuration may be provided. In one implementation, the first member 232 further comprises a recessed cavity 226 at the middle section 237 that effectively contains an electronic circuit 228. In this implementation, the electronic circuit 228 is designed to accept inputs from several sensing components. This cavity 226 may be surrounded by a Faraday cage 230 to effectively nullify the effects of high voltage EMF influence from the conductor 202 on the circuitry 228. The Faraday cage may also surround the current transformer 222. The cover plate, or cover plate member, 234 can cover the top opening to the cavity 226 to retain the electronic circuit inside the body, or upper body section, 214. The electronics may be housed in a metal or plastic container, surrounded by the noted Faraday cage, and the entire assembly can be potted, such as with epoxy for example.

The electronic circuit 228 can accept and quantify in a meaningful manner various inputs for monitoring various parameters of the conductor 202 and the surrounding environment. The inputs can also be derived from externally mounted electronic referencing devices/components. The inputs can include, for example: Line Current reference (as derived from the Current transformer 222, 224 or other means); Barometric pressure and Temperature references—internal and ambient (as derived from internal and external thermocouples 236, 238 or other means); Vibration references of the conductor (as derived from the accelerometer 240, such as a 0.1-128 Hz sensor, for example, or other means); and Optical references (as derived from the photo transistor 242 in a fiber optic tube or other means). Tensile references from the tensile indicators 244 may, for example, provide information indicating that ice is forming as the weight of the conductor increases due to ice build up.

Supervisory Control And Data Acquisition (SCADA) generally refers to an industrial control system such as a computer system monitoring and controlling a process. Information derived by the electrical/electronic circuitry can exit the circuit 228 via a non-conductive fiber optic cable 246 and be provided up and over to the transmission tower 200 and ultimately at the base of the tower and fed into the user's SCADA system to allow the end user to access and view electrical and environmental conditions at that sight, or the information can be transmitted to a remote or central site. The clamp or other sensing device may be alternatively configured to wirelessly transmit information from the electronic circuit 228 to a receiver system. Collected data can also be provided to customer via communication and data collections systems that are not part of the SCADA system.

According to example embodiments of the present disclosure, electronic circuitry 228 can include one or more computing devices configured to implement logic for corona detection according to example embodiments of the present disclosure. The electronic circuitry 228 can include a microphone and one or more computing devices. In some embodiments, the electronic circuitry 228 can implement the system for detecting corona discussed in detail with reference to FIG. 11 below.

In some embodiments, the one or more computing devices can be located remotely from the clamp. For instance, the electronic circuitry 228 can communicate audio data collected by a microphone to a remote computing system (e.g., a server computing system, smartphone, table, etc.). The audio data can be processed by the remote computing system according to example aspects of the present disclosure for corona detection.

Figure 10:
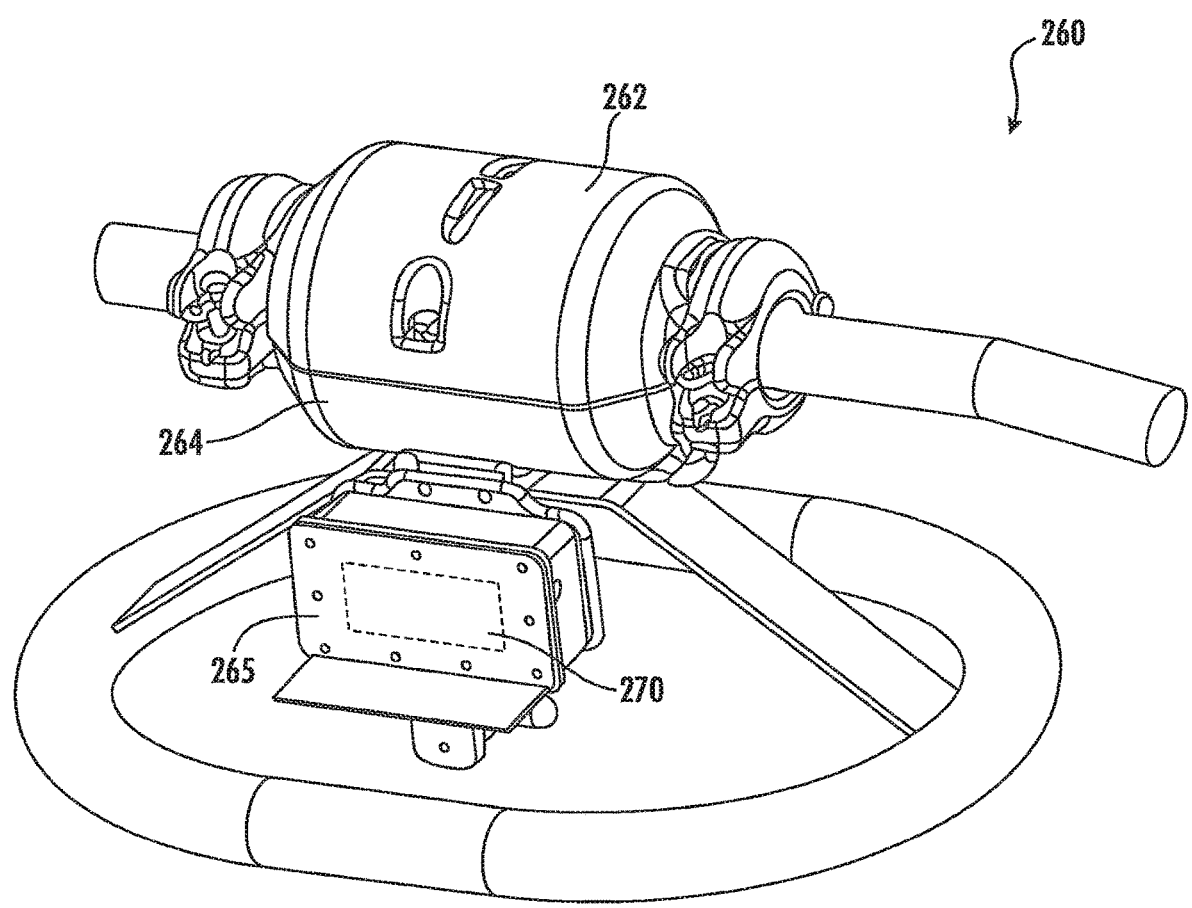
FIG. 10 depicts a perspective view of an example clamp configured to be secured to a conductor away from a transmission tower according to example embodiments of the present disclosure.

In some embodiments, the systems and methods for corona detection according to aspects of the present disclosure can be implemented in a clamp configured to be secured to a power transmission line away from a support tower. FIG. 10 depicts an example clamp 260 configured to be secured to a power transmission line or other conductor away from a support tower and configured for of corona detection according to example aspects of the present disclosure. As shown the clamp 260 can include upper and lower sections 262, 264 configured to be secured to a power transmission line. Upper and lower sections 262 and 264 can each have embedded within their respective bodies one-half of a current transformer. When these components 262 and 264 are joined, they form an electromagnetic circuit that allows, in some applications, the sensing of current passing through the conductor. In one implementation, the current transformer is used for current sensing, data collection, data analysis and data formatting devices.

In some embodiments, the clamp can include a housing 265. The housing 265 can house an electronic circuit 270. The electronic circuit 270 can accept and quantify in a meaningful manner various inputs for monitoring various parameters of the conductor and the surrounding environment. The inputs can also be derived from externally mounted electronic referencing devices/components. The inputs can include, for example: Line Current reference (as derived from the current transformer or other means); Barometric pressure and Temperature references—internal and ambient (as derived from internal and external thermocouples or other means); Vibration references of the conductor (as derived from the accelerometer, such as a 0.1-128 Hz sensor, for example, or other means); and Optical references (as derived from the photo transistor in a fiber optic tube or other means). Tensile references from the tensile indicators may, for example, provide information indicating that ice is forming as the weight of the conductor increases due to ice buildup.

The clamp may be alternatively configured to transmit information (e.g., through a combination of wired and/or wireless links) from the electronic circuit 270 to a receiver system. Collected data can also be provided to the customer via communication and data collections systems that are not part of the SCADA system.

According to example embodiments of the present disclosure, electronic circuitry 270 can include one or more computing devices configured to implement logic for corona detection according to example embodiments of the present disclosure. The electronic circuitry 270 can include a microphone and one or more computing devices. In some embodiments, the electronic circuitry 270 can implement the system for detecting corona discussed in detail with reference to FIG. 11 below.

In some embodiments, the one or more computing devices can be located remotely from the clamp. For instance, the electronic circuitry 270 can communicate audio data collected by a microphone to a remote computing system (e.g., a server computing system, smartphone, table, etc.). The audio data can be processed by the remote computing system according to example aspects of the present disclosure for corona detection.

Aspects of the present disclosure are discussed with reference to a clamp configured to detect corona based at least in part on audio data. Those of ordinary skill in the art, using the disclosures provided herein, will understand that the systems and methods for corona detection can be used in other applications.

As an example, the systems and methods for corona detection based on audio data can be implemented using a drone or other aerial vehicle. The drone or other aerial vehicle can include a microphone (e.g., a directional microphone). The drone or other aerial vehicle can be controlled to fly close to an electrical system (e.g., power transmission lines, substations, etc.). Audio data picked up by the microphone can be processed according to example embodiments of the present disclosure for corona detection.

As another example, the system and methods for corona detection based on audio data can be implemented using a ground based vehicle. The ground based vehicle can include a microphone (e.g., a directional microphone). The ground based vehicle can be driven under or near an electrical system (e.g., power transmission lines, substations, etc.). Audio data picked up by the microphone can be processed according to example embodiments of the present disclosure for corona detection.

As another example, the systems and methods for corona detection based on audio data can be implemented in a utility cabinet housing various components of an electrical system (e.g., switches, transformers, buses, conductors, etc.). A microphone and one or more computing devices (e.g., processors and one or more memory devices) can be located within the cabinet. Audio data collected by the microphone can be processed according to example embodiments of the present disclosure for corona detection.

As another example, the systems and methods for corona detection based on audio data can be implemented in a user device, such as a smartphone, tablet, wearable device, laptop, or device capable of being carried by a user while in operation. The user device can include a microphone configured to capture audio data. Audio data picked up by the microphone can be processed (e.g., either locally on the device or remotely) according to example embodiments of the present disclosure for corona detection.

Figure 11:
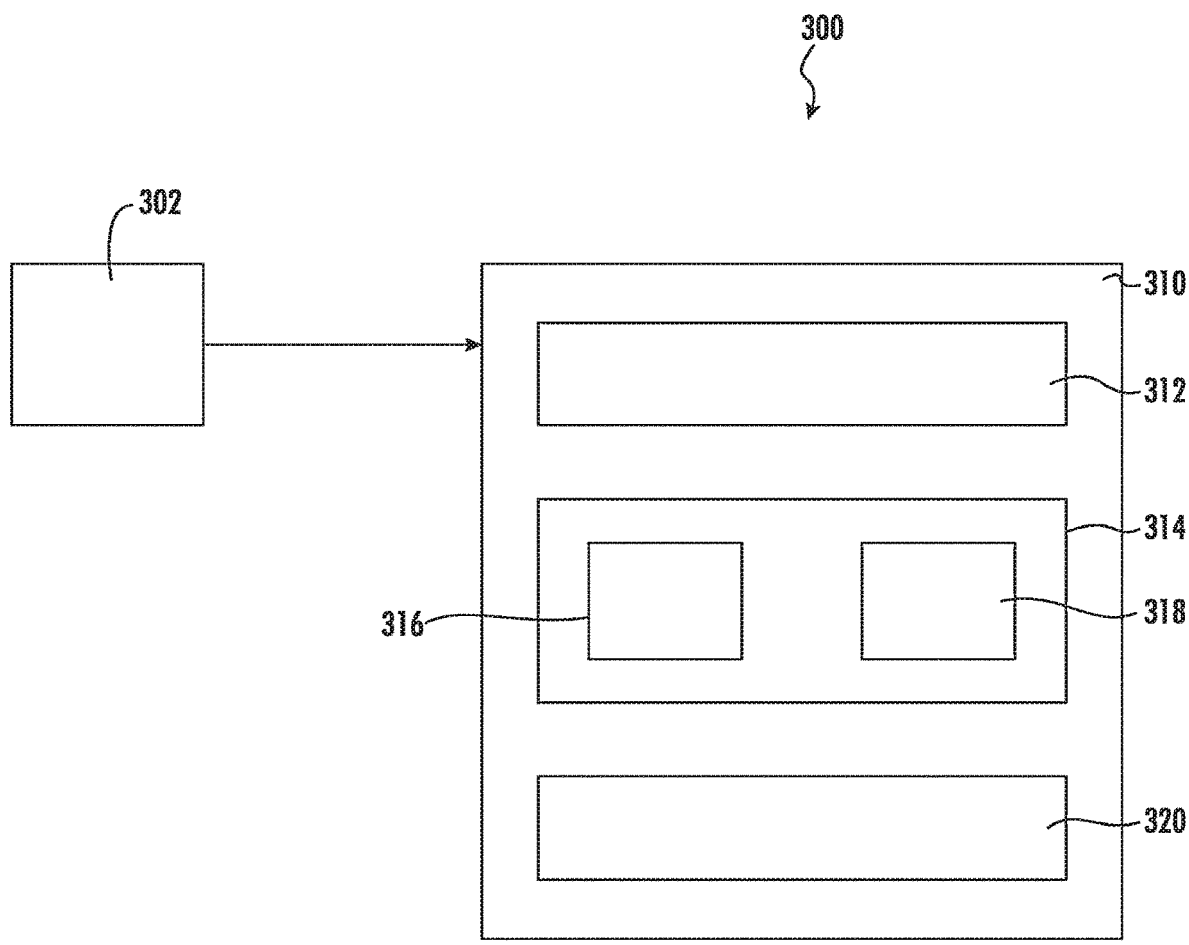
FIG. 11 depicts a block diagram of an example system according to example embodiments of the present disclosure.

FIG. 11 depicts a block diagram of an example system 300 according to example embodiments of the present disclosure. As discussed above, the system 300 can be implemented as part of a clamp or other device (e.g., ground based or aerial vehicle). The system 300 includes a microphone 302. The microphone 302 can be configured to capture audio data. In some embodiments, the microphone 302 can be a directional microphone configured to capture audio data from a distance. The audio data captured by the microphone 302 can be provided to a computing system 310 having one or more computing devices.

The computing system 310 can include one or more processors 312 and one or more memory devices 314. The one or more processors 312 can be any suitable processing device (e.g., a processor core, a microprocessor, an ASIC, a FPGA, a controller, a microcontroller, etc.) and can be one processor or a plurality of processors that are operatively connected. The memory devices 314 can include one or more non-transitory computer-readable storage media, such as RAM, ROM, EEPROM, EPROM, one or more memory devices, flash memory devices, etc., and combinations thereof.

The memory devices 314 can store instructions 316 and data 318 accessible by the one or more processors 312. The instructions 316 can be instructions used to implement logic for corona detection according to example embodiments of the present disclosure, such as the processing logic depicted in FIG. 1 and/or the operations depicted in FIGS. 12-14. The instructions 316 can be programmed in software and/or hardware implemented. When implemented in software, any suitable programming language can be used.

The system 300 can further include a network interface 320. The network interface 320 can be used to communicate information (e.g., information associated with detected corona) to other devices over a network (e.g., via an optical fiber, via wireless communication, etc.). The network interface 320 can include one or more of, for example, a communications controller, receiver, transceiver, transmitter, port, conductors, software and/or hardware for communicating data.

Figure 12:
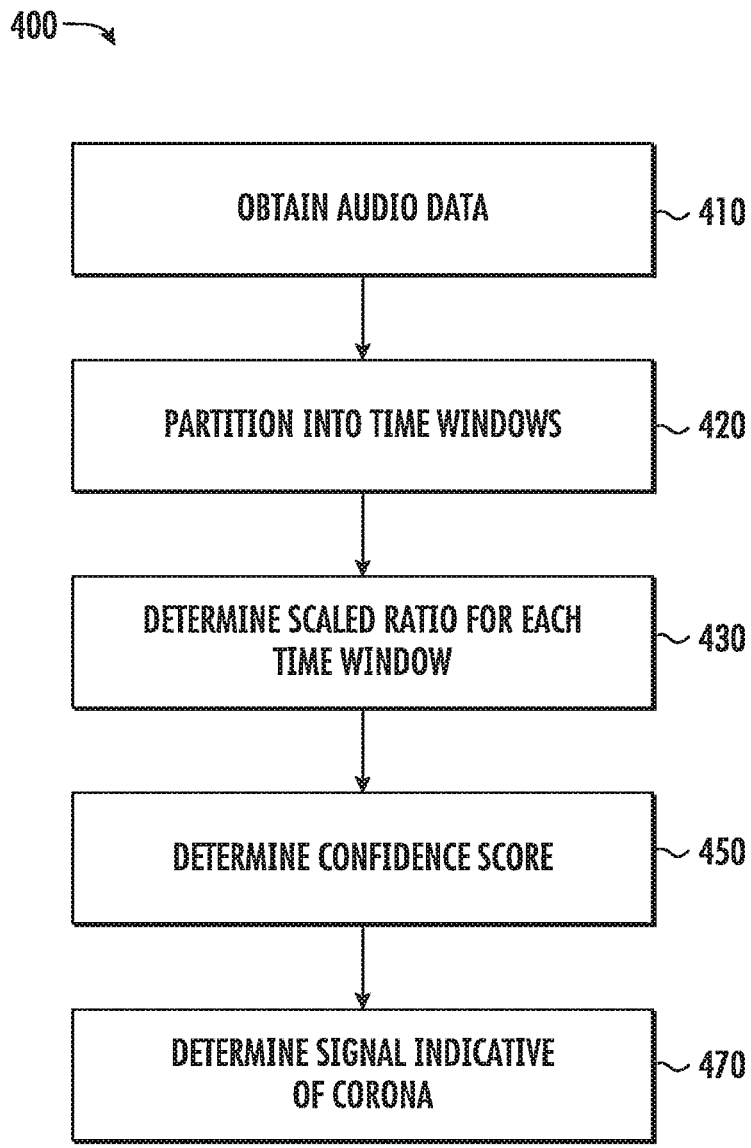
FIG. 12 depicts a flow diagram of an example method according to example embodiments of the present disclosure.
Figure 13:
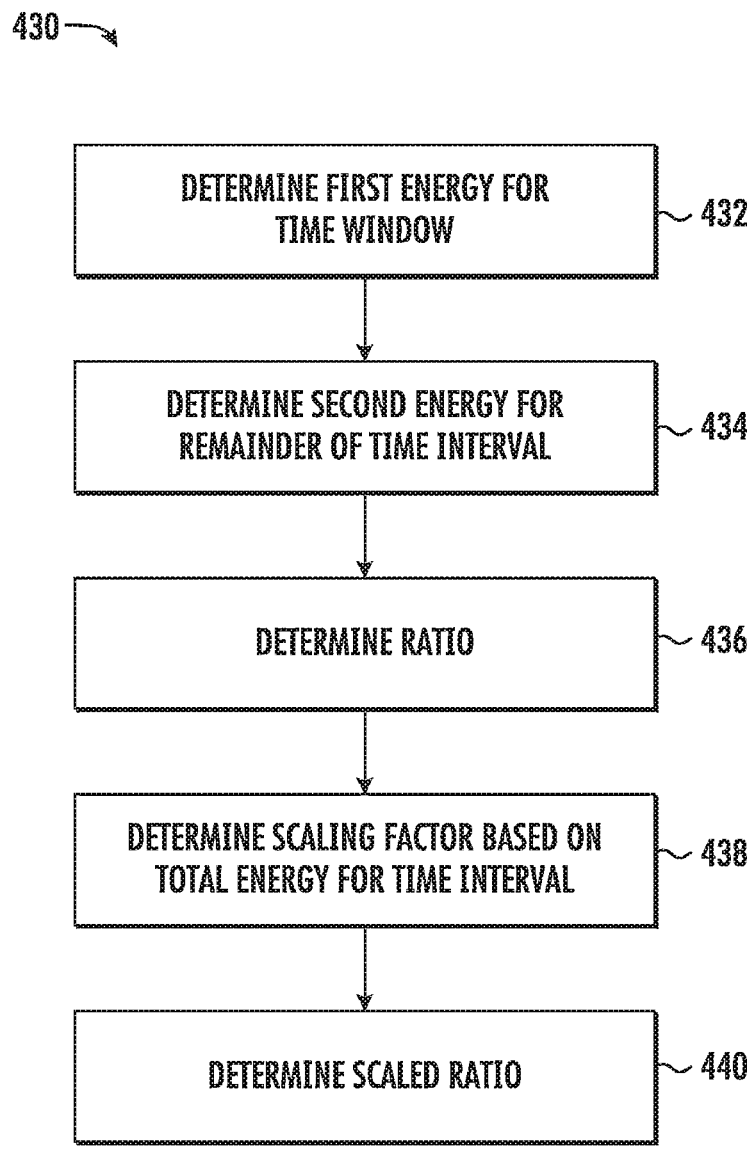
FIG. 13 depicts a flow diagram of an example method according to example embodiments of the present disclosure.
Figure 14:
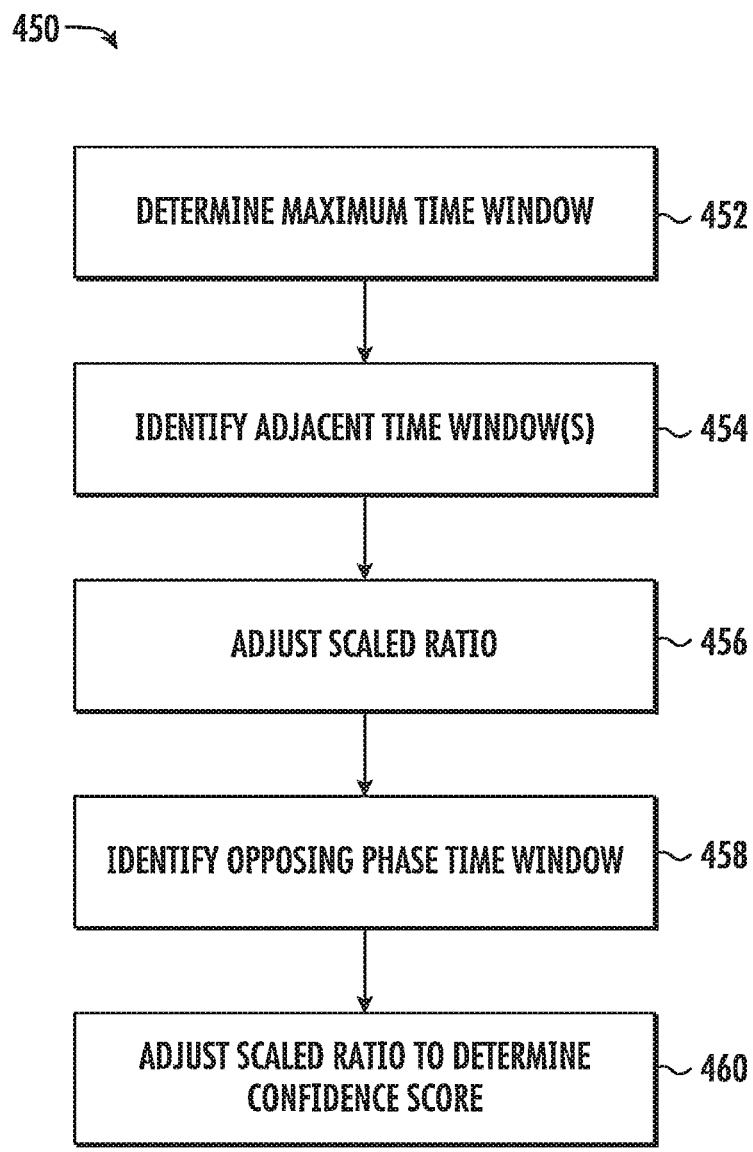
FIG. 14 depicts a flow diagram of an example method according to example embodiments of the present disclosure.

FIGS. 12-14 depict flow diagrams associated with an example method (400) according to example embodiments of the present disclosure. The method can be implemented, for instance, by the one or more computing devices depicted in FIG. 11. The method can implement the processing logic discussed in more detail with respect to FIG. 1. FIGS. 12-14 depict steps performed in a particular order for purposes of illustration and discussion. Those of ordinary skill in the art, using the disclosures provided herein, will understand that various steps of any of the methods disclosed herein can be omitted, adapted, expanded, performed simultaneously, rearranged, and/or modified in various ways without deviating from the scope of the present disclosure.

At (410), the method can include obtaining audio data. The audio data can be indicative of audio of an electrical system. The audio data can be obtained from, for instance, a microphone. The audio data can be obtained for at least one time interval. The time interval can be determined based on a primary frequency of the electrical system (e.g., 60 Hz or 50 Hz). For instance, in a 60 Hz system, the time interval can be about 16.67 ms). In a 50 Hz system, the time interval can be about 20 ms.

At (420), the method can include partitioning the audio data into a plurality of time windows. Each time window can be a subpart of the time interval. In some embodiments, the audio data can be partitioned into ten time windows where each time window has a duration of about 10% of a duration of the time interval.

At (430), the method includes determining a scaled ratio for each time window. The scaled ratio for each time window can be used to determine a signal indicative of the presence of corona based on audio data collected within an identified time window of the plurality of time windows relative to audio data collected for the remainder of the time interval.

FIG. 13 depicts a flow diagram of determining a scaled ratio for each time window according to example embodiments of the present disclosure. At (432), the method includes determining a first energy for the time window based at least in part on audio data collected within the time window. The first energy can be a measure of the audio data collected within the time window. The first energy can be determined, for instance, using a low pass filter or other suitable methods.

At (434), the method includes determining a second energy for the time window based at least in part on audio data collected for the remainder of the time interval outside the time window. The second energy can be a measure of the audio data collected within the time window. The second energy can be determined, for instance, using a low pass filter or other suitable methods.

At (436), the method can include determining a ratio of the first energy and the second energy. For instance, the method can include dividing the first energy by the second energy to determine the ratio.

At (438), the method can include determining a scaling factor based at least in part on a total energy for the time interval. The scaling factor can be based on a total energy for the time interval. The scaling factor can be an indicator of an adequacy of a sound level for the audio data to detect corona during the time interval.

In example embodiments, as discussed with reference to FIGS. 1 and 3 above, the scaling factor can be determined based on total energy for the time interval. More particularly, the scaling factor can be 0 when the total energy is less than a first threshold. This can disable corona detection when the audio signal is too low. The scaling factor can vary linearly when the total energy is greater than the first threshold but less than a second threshold. This can cause for linear scaling of the corona detection at intermediate sound levels. The scaling factor can be 1 when the total energy is greater than the second threshold to allow for full corona detection.

At (440) of FIG. 12, the scaled ratio for the time window is determined based at least in part on the scaling factor and the ratio of the first energy and the second energy for the time window. In some implementation, as discussed above, the scaled ratio can be determined as follows:

$$R=p*(Q-1)$$

where p is the scaling factor, Q is the ratio of the first energy and the second energy, and R is the scaled ratio.

Referring to FIG. 12 at (450), the method can include determining a confidence score based at least in part on the scaled ratio. The confidence score can be indicative of the presence of corona in the electrical system. Example aspects of the present disclosure can process the signals based on ratios in adjacent time windows to improve detection of corona that can span several time windows.

FIG. 14 depicts a flow diagram of determining a confidence score according to example embodiments of the present disclosure. At (452), the method includes identifying a maximum time window associated with a maximum scaled ratio. At (454), the method includes identifying adjacent time windows to the maximum time window. At (456), an adjustment is made to the scaled ratio for the maximum time window based on a scaled ratio for the adjacent time windows. For example, any value of the scaled ratio above 0 for an adjacent time window can be added to the scaled ratio for the maximum time window.

At (458), the method can include identifying an opposing phase time window. The opposing phase time window can be, for instance, 180° out of phase with the maximum time window. At (460), the method can include adjusting the scaled ratio associated with the maximum time window to determine the confidence score. For example, if the value of a scaled ratio for opposing phase time window is greater than 0, the value of the scaled ratio above 0 can be subtracted from the scaled ratio associated with the maximum time window to generate the confidence score.

Referring to FIG. 12 at (470), the method can include determining a signal indicative of corona based at least in part on the confidence score. For example, in some embodiments, the confidence score can be provided to a low pass filter to determine a signal indicative of the presence of corona.

In some embodiments, information can be added (e.g., time stamps) to the signal indicative of the presence of corona to enrich the information associated with the signal indicative of the presence of corona. In some embodiments, the signal indicative of the presence of corona can be communicated by the system via a network interface. For instance, the signal can be communicated over a network to one or more other devices.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for detecting corona in an electrical system, the method comprising:
   obtaining, by one or more computing devices, audio data during at least one time interval, the time interval including a plurality of time windows;
   partitioning, by the one or more computing devices, the audio data into a plurality of window audio data each corresponding to a respective one of said time windows; and
   determining, by the one or more computing devices, a signal indicative of a presence of corona based at least in part on at least one window audio data relative to a remainder audio data wherein said remainder audio data includes interval audio data absent the selected one of the window audio data.

2. The method of claim 1, wherein determining, by the one or computing devices, a signal indicative of a presence of corona comprises:
   determining, by the one or more computing devices, a first energy associated with an identified time window of the plurality of time windows based at least in part on the audio data;
   determining, by the one or more computing devices, a second energy associated with a remainder of the time interval based at least in part on the audio data;
   determining, by the one or more computing devices, a ratio of the first energy and the second energy; and
   determining, by the one or more computing devices, a signal indicative of the presence of corona based at least in part on the ratio of the first energy and the second energy.

3. The method of claim 1, wherein the method comprises:
   determining, by the one or more computing devices, a total energy for the time interval based on the audio data; and
   determining, by the one or more computing devices, an indicator of an adequacy of a sound level for the audio data to detect corona based at least in part on the total energy.

4. The method of claim 1, further comprising:
   determining, by the one or more computing devices, the signal indicative of the presence of corona based at least in part on the ratio for the identified time window and a ratio for one or more adjacent time windows in the time interval.

5. The method of claim 4, further comprising:
   determining, by the one or more computing devices, a scaled ratio for each of the plurality of time windows;
   identifying, by the one or more computing devices, a time window with a maximum scaled ratio of the plurality of time windows;
   identifying, by the one or more computing devices, one or more adjacent time windows to the time window associated with the maximum scaled ratio;
   identifying, by the one or more computing devices, an opposing phase time window to the time window associated with the maximum scaled ratio; and
   determining, by the one or more computing devices, a confidence score based on the maximum scaled ratio, a scaled ratio associated with one or more adjacent time windows, and a scaled ratio for the opposing phase time window.

6. The method of claim 5, wherein the scaled ratio for each of the plurality of time windows is determined based at least in part on an adequacy of a sound level for the audio data to detect corona during the time interval.

7. The method of claim 4, further comprising:
   filtering a confidence score to generate the signal indicative of the presence of corona.

8. The method of claim 1, wherein the time interval is determined based at least in part on a frequency of electrical power in the electrical system.

9. The method of claim 1, wherein each time window has a duration of about 10% of the time interval.

10. The method of claim 1, wherein the method is implemented at least in part by one or more processors associated with a clamp device.

11. The method of claim 1, further comprising providing time stamp data in the signal associated with the presence of corona.

12. The method of claim 1, further comprising communicating, by the one or more computing devices, a notification associated with the presence of corona via a network interface.

13. A system for detecting corona in an electrical system, the system comprising:
   a microphone configured to obtain audio data associated with the electrical system;
   a network interface;
   one or more processors; and
   one or more memory devices, wherein the one or more memory devices store computer-readable instructions that when executed by the one or more processors cause the one or more processors to perform operations, the operations including:
      obtaining audio data from the microphone, the audio data during at least one time interval, the time interval partitioned into a plurality of time windows;
      partitioning the audio data into a plurality of window audio data each corresponding to a respective one of said time windows;
      determining a signal indicative of a presence of corona based at least in part on at least one window audio data relative to a remainder audio data, wherein said remainder audio data includes interval audio data absent the selected one of the window audio data.

14. The system of claim 13, further comprising:
   determining a first energy associated with the selected window audio data;
   determining a second energy associated with the remainder audio data;
   determining a ratio of the first energy and the second energy; and
   determining the signal indicative of the presence of corona based at least in part on the ratio of the first energy and the second energy.

15. The system of claim 13, wherein the operations comprise:
   determining a total energy for the time interval based on the audio data; and
   determining an adequacy of a sound level for the audio data to detect corona during the time interval based at least in part on the total energy.

16. The system of claim 14, further comprising:
   determining a scaled ratio for each of the plurality of time windows;
   identifying a time window with a maximum scaled ratio of the plurality of time windows;
   identifying one or more adjacent time windows to the time window associated with the maximum scaled ratio;
   identifying an opposing phase time window to the time window associated with the maximum scaled ratio; and determining a confidence score based on one the maximum scaled ratio, a scaled ratio associated with one or more adjacent time windows, and a scaled ratio for the opposing phase time window.

17. The system of claim 13, wherein the microphone is a directional microphone on an aerial or ground based vehicle.

* * * * *